United States Patent

Huang et al.

[11] Patent Number: 6,036,784
[45] Date of Patent: Mar. 14, 2000

[54] APPARATUS FOR HOLDING SUBSTRATES

[75] Inventors: Gwo-Jou Huang; Jong-Yen Lin, both of Hsinchu; Chieh-Ling Hsiao, Hsinchu Hsien, all of Taiwan

[73] Assignee: Industrial Technology Research Institute, Hsinchu Hsien, Taiwan

[21] Appl. No.: 09/025,251

[22] Filed: Feb. 18, 1998

[51] Int. Cl.[7] .................................................. C23C 16/00
[52] U.S. Cl. ........................ 118/728; 118/715; 118/500; 156/345; 269/37; 269/53; 204/298.15
[58] Field of Search ..................................... 118/715, 728, 118/500; 414/609; 204/298.15; 269/37, 53; 206/710; 156/345

[56] References Cited

U.S. PATENT DOCUMENTS 4,189,230  2/1980  Zasio .......................................... 355/76

*Primary Examiner*—Richard Bueker
*Assistant Examiner*—Norca L. Torres
*Attorney, Agent, or Firm*—McDermott, Will & Emery

[57] ABSTRACT

An apparatus for holding substrate includes a base housing. A plurality of pins are set on the top surface of the base housing. Further, the top surface has a plurality of openings through the top surface. The base housing has a first opening set on the bottom portion of one side of the base housing. Lift means is set in the base housing. A support member having an oblique surface structure is provided in the cylindrical housing and can upwardly pass through an opening formed on top of the cylindrical housing. A plate having a plurality of pins formed thereon is connected to the top of the support member. A substrate holder can be separated from the base housing, and the substrate holder includes a plate. A glass substrate is fixed on the plate by means of a plurality of fixers.

14 Claims, 3 Drawing Sheets

APPARATUS FOR HOLDING SUBSTRATES

FIELD OF THE INVENTION

The present invention relates to a holder, and more specifically, to a apparatus for holding substrates that is used to manufacture thin film transistors or a liquid crystal display (LCD).

BACKGROUND

Semiconductor technology has been developed for years in a brisk pace. In order to achieve high packing density wafer for ultra large scale integrated (ULSI) circuits, the dimensions of devices have been scaled down to sub-micron range. A lot of semiconductor devices and integrated circuits are applied in the field of manufacturing computers. Computer has become an important tool in life. Thin film transistors (TFT) and a liquid crystal display (LCD) are widely employed in the computer technology, such as note book computer, for displaying. Thus, the technique for making the TFT and the LCD has become a key technology in the computer industry. How to manufacture thin film transistors or the LCD with high yield is an important issue for present.

A glass substrate is required during the formation of the TFT or LCD. Thus, an apparatus for holding the substrate is provided in order to deposit thin films on the substrate. A convention apparatus includes a plate for positing the glass substrate. A plurality of fixer is formed on the plate to fix the substrate. However, the conventional apparatus can not achieve the requirement to obtain high yield devices. For example, the substrate is always crashed by an operator when the substrate is loaded or unloaded and the backside of the substrate is always damage. Further, particles that are generated during the formation always stay on the surface of the plate. It usually needs a sandblast process to perform on the surface of the apparatus after the apparatus is used. In addition, electric static discharge problem will arise due to charges will accumulate on the surface of the plate. According to the conventional apparatus, the substrate can only be set up on the apparatus by hand, which will cause contaminate problem.

What is required is an improved apparatus for holding substrates.

SUMMARY

An apparatus for holding substrate includes a base housing to provide a space for holding elements of the present invention. One side of the base housing has an indented portion. A plurality of pins are set on the top surface of the base housing. Further, the top surface has a plurality of openings through the top surface. The base housing has a first opening set on the bottom portion of one side of the base housing. Lift means is set in the base housing. A substrate can be raised and fall by the lift means. The lift means includes a cylindrical housing to provide a space. The cylindrical housing has a second opening. An operational rod that is set in the cylindrical housing extends through second opening and first opening.

A support member having an oblique surface structure is provided in the cylindrical housing and can upwardly pass through a third opening formed on top of the cylindrical housing. The top of the oblique surface structure is connected at the bottom of the support member.

A plate having a plurality of pins formed thereon is connected to the top of the support member. A fixer is set in the base housing adjacent to the first opening to fix the operational rod. A first rotatable unit is mounted on the end of the operational rod for moving the oblique surface structure to upwardly move. A second rotatable unit is mounted on the operational rod between the fixer and the first rotatable unit. A substrate holder can be separated from the base housing, and the substrate holder includes a plate. The plate has a plurality of openings formed thereon and aligned to the pins which are formed on the top surface of the base housing. A glass substrate is fixed on the plate by means of a plurality of fixers. A plurality of metal sheets are set on the edge of the glass substrate to enhance the strength of the glass substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention is an apparatus for holding a substrate that is used to form a liquid crystal display (LCD) or thin film transistors (TFT). The preferred embodiment of the present invention will be described as follows.

Figure 1:
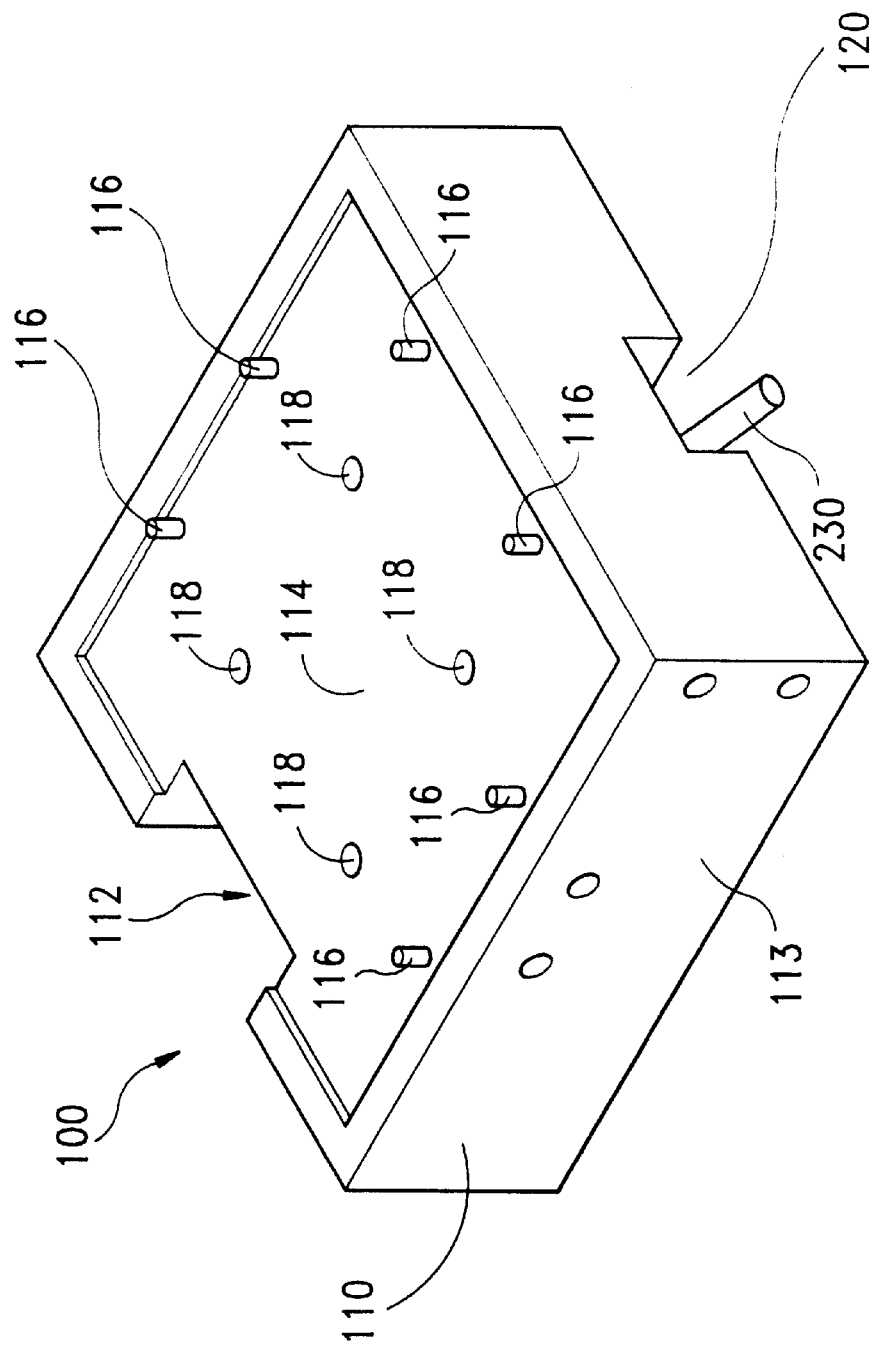
FIG. 1 is an apparatus for holding substrates in accordance with the present invention.
Figure 2:
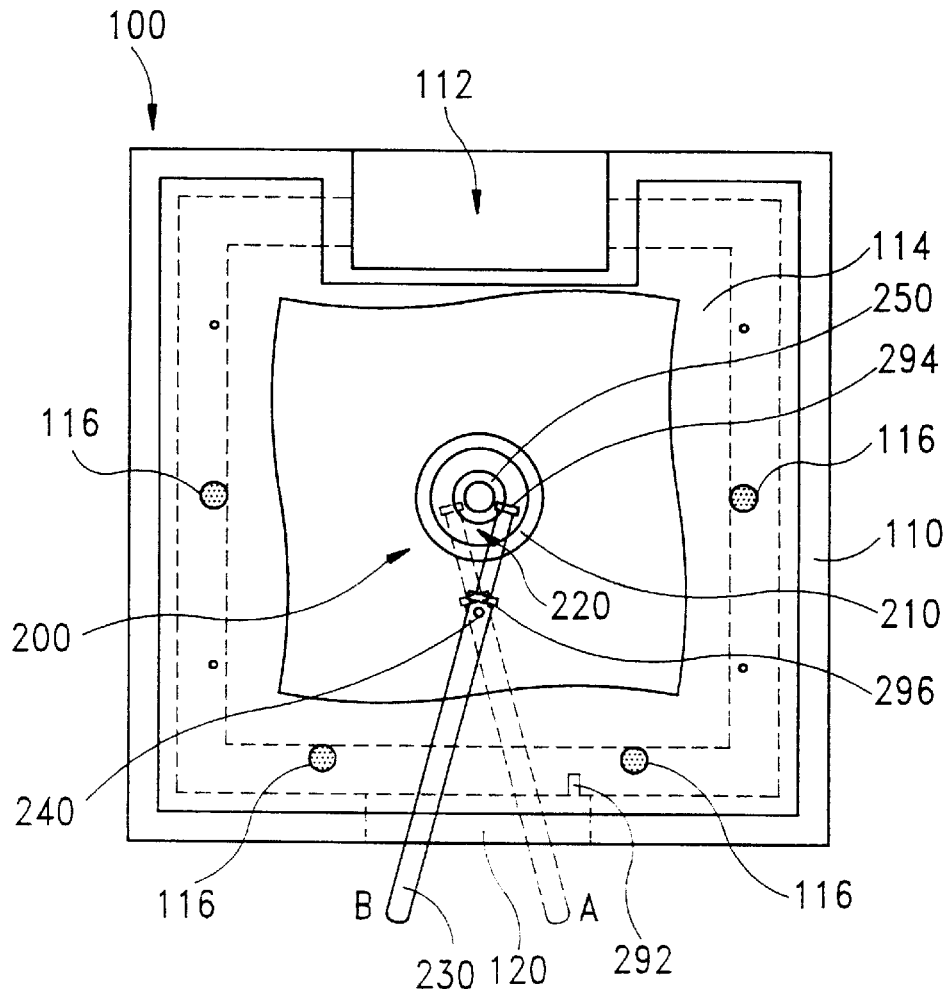
FIG. 2 is a scheme illustrating a top view of the apparatus for holding substrates in accordance with the present invention.
Figure 3:
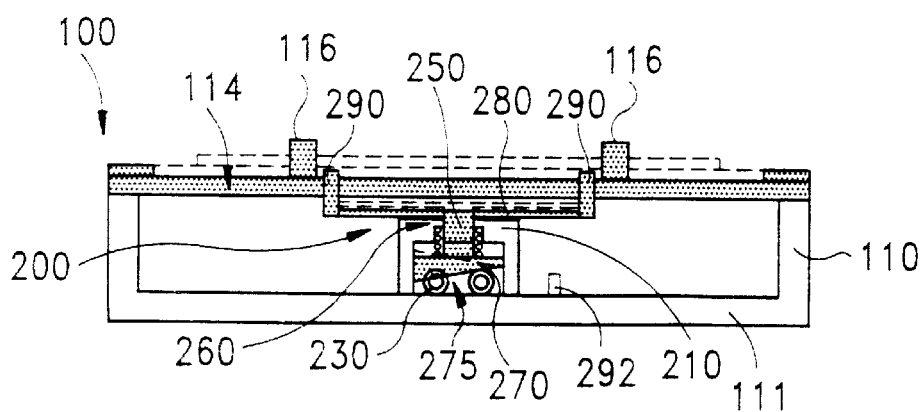
FIG. 3 is a scheme illustrating a side view of the apparatus for holding substrates in accordance with the present invention.

Referring to FIG. 1, it shows an apparatus 100 for holding substrates according to the present invention. FIG. 2 and FIG. 3 are schemes illustrating a top, side views of the apparatus for holding substrates in accordance with the present invention, respectively. The apparatus 100 includes a base housing 110 to provide a space for holding elements of the present invention. The base housing have a top surface 114, a bottom surface 111, and a surrounding wall 113 connected to the top, the bottom surfaces. The surface of the base housing 110 is formed with an isolation layer by using anode treatment. In order to conveniently load or unload a substrate holder 300 (FIG. 4), one side of the surrounding wall 113 of the base housing 110 has an indented portion 112. A plurality of pins 116 are set on the top surface 114 and along the edge of the top surface 114 of the base housing 110. Further, the material for the top surface 114 of te base housing 110 includes stainless steel and has a plurality of openings 118 through the top surface 114. The base housing 110 has a first opening 120 set on the bottom portion of one side of the base housing 110.

Lift means 200 is set in the base housing 110, as shown in FIGS. 2, 3. A substrate can be raised and fall by the lift means 200. In an preferred embodiment, the lift means 200 includes a cylindrical housing 210 to provide a space. The cylindrical housing 210 has a second opening 220 corresponding to the first opening 120 of the base housing 110. An operational rod 230 that is set in the cylindrical housing 210 extends through second opening 220 and first opening 120. The operational rod 230 that is connected to the cylindrical housing 210 pass through the second opening 220 and first opening 120 and extending out of the base housing 100. An operator can raise or lower the substrate by the lift means 200 via the operational rod 230. The operational rod 230 can be rotated via an axis 240 that is fixed in the base housing 110.

A support member 250 having an oblique surface structure 270 is provided in the cylindrical housing 210 and can upwardly pass through a third opening 260 formed on top of the cylindrical housing 210. The top of the oblique surface structure 270 is connected at the bottom of the support member 250. The structure 270 has an oblique surface 275 formed at the bottom side of the structure 270. The operational rod 230 is used for moving the support member 250 upward and downward. For example, turning to FIG. 2, when the operational rod 230 is at position A, the operational rod 230 forces the support member 250 to be raised via the oblique surface 275. On the contrary, the support member 250 is lowered when the operational rod 230 is at the position B.

A plate 280 having a plurality of pins 290 formed thereon is connected to the top of the support member 250. When the support member 250 is raised, the pins 290 are also moved upwardly, and protrude into the openings 118 that is on the top surface of the base housing 110. Thus, the substrate on the top surface will be raised by the support member 250.

In order to prevent the support member 250 from downwardly moving back to the lower position when the support member 250 is raised by means of the operational rod 230. A fixer 292 is set in the base housing 110 adjacent to the first opening 120 to fix the operational rod 230 when the operational rod 230 is at the position A. A first rotatable unit 294 is mounted on the end of the operational rod 230 for moving the oblique surface structure 270 to upwardly move. A second rotatable unit 296 is mounted on the operational rod 230 between the fixer 292 and the first rotatable unit 294, and adjacent to the second rotatable unit 296 to act as a supporter.

Figure 4:
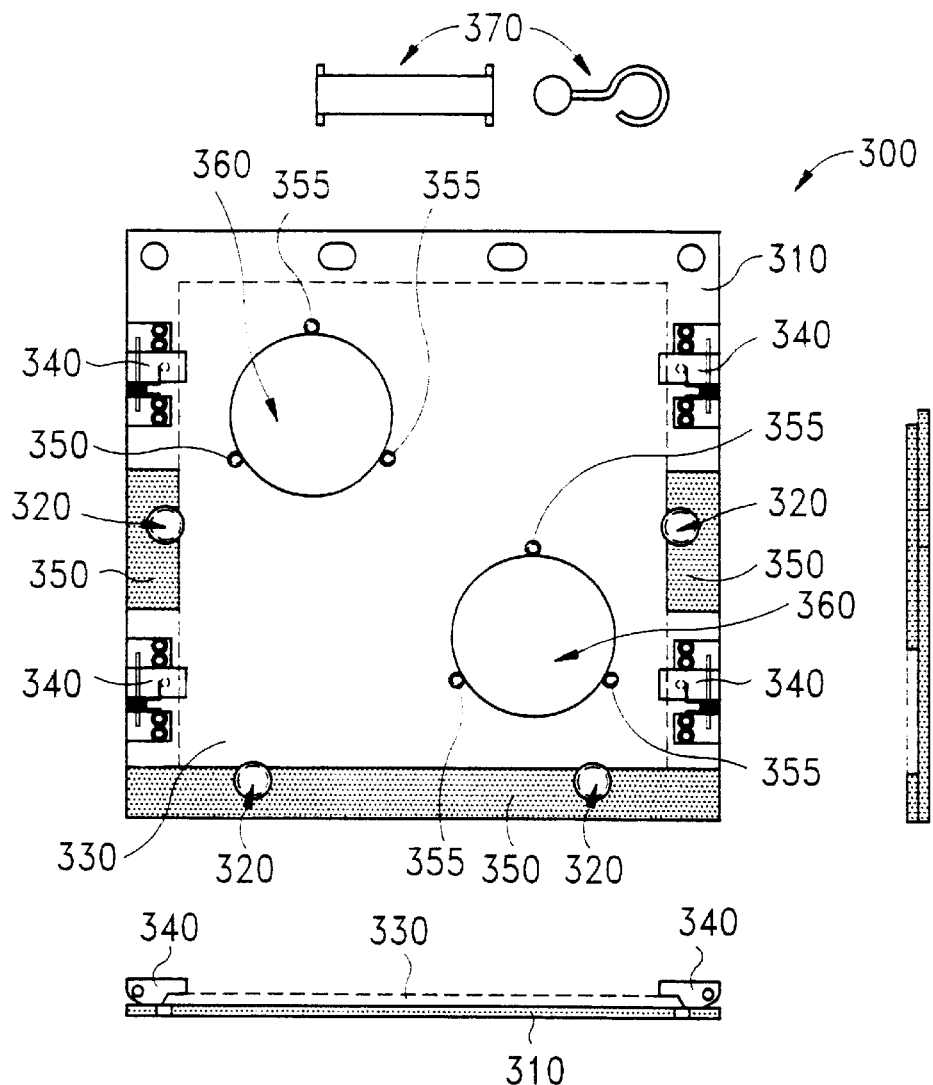
FIG. 4 is a scheme illustrating a substrate holder in accordance with the present invention.

As shown in FIG. 4, it shows a substrate holder 300 according to the present invention. The substrate holder 300 can be separated from the base housing 110, and the substrate holder 300 includes a plate 310, such as a rectangular or square plate. The plate has a plurality of openings 320 formed thereon and aligned to the pins 116 which are formed on the top surface 114 of the base housing 110. When the substrate holder 300 is load on the top surface 114 of the base housing 110, then the pins 116 will pass through the openings 320 and fix the substrate holder 300.

A glass substrate 330 is fixed on the plate 310 by means of a plurality of fixers 340. Preferably, the fixers 340 are made of electrical conductive material, such as metal or the like, and contacts the surface of the glass substrate 330. Therefore, the charge that accumulates on the glass substrate 330 during the formation will be conducted to ground via the fixers 340. This arrangement can prevent the electrical static discharge problem. A plurality of metal sheets 350 are set on the edge of the glass substrate to enhance the strength of the glass substrate 330. Further, the plate 310 has a plurality of holes having threads 355 formed therein to fix a monitor wafer 360. A handle 370 that is used to lift the substrate holder 300 can be separated from the substrate holder 300.

Figures 5A, 5B:
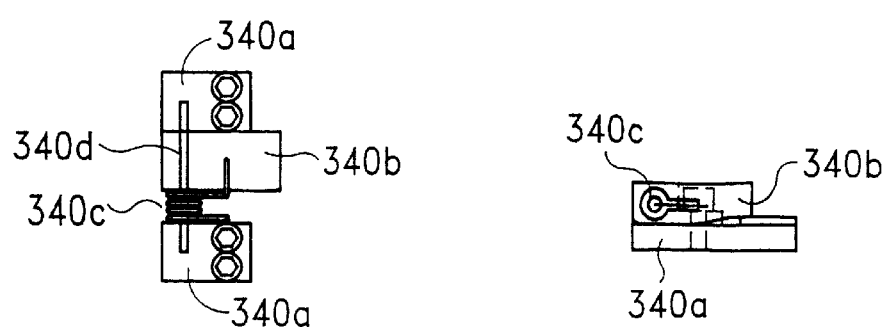
FIG. 5A is a scheme illustrating a top view of a fixer in accordance with the present invention.
FIG. 5B is a scheme illustrating a side view of the fixer in accordance with the present invention.

The fixer 340 on the substrate holder 300 which is shown in FIGS. 5A and 5B includes a base plate 340a attached on the substrate holder 300, a fixing member 340b connected on the base plate 340a via an rotating axis 340d having a driving spring 340c formed thereon.

In practicing the apparatus, the glass substrate 330 having monitor wafer 360 is fixed on the substrate holder 300 by means of fixers 340, first. Then, the lift means 200 is raised by using the operational rod 230. The pins 290 on the plate 280 protrude into the openings 118 that is on the top surface of the base housing 110. Subsequently, the substrate holder 300 is load on the plate 280. Then, the lift means 200 is lowered by using the operational rod 230 and the substrate holder 300 is fixed on the base housing 100 by using the pins 116 through the openings 320 on the substrate holder 300. After the reaction of process, the substrate holder 300 can be unload by using the operational rod 230. The hand of an operator will not touch the surface of the substrate holder 300. Thus, the present invention eliminates the particulate problems, electrical static discharge problem.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An apparatus for holding a substrate, said apparatus comprising:

a base housing having a top surface, a bottom surface, and a surrounding wall connected to said top and bottom surfaces for providing a space to hold elements of said apparatus, said surrounding wall having a first opening, said top surface having a plurality of first pins and a plurality of second openings;

lift means formed in said base housing for lifting and lowering said substrate;

an operational rod connected to said lift means passing through said first opening and extending out of said base housing, wherein said operational rod can rotate via an axis set in said base housing, a first fixer in said base housing to fix said operational rod when said substrate is being raised; and a substrate holder on said top surface of said base housing for holding said substrate including a first plate having a plurality of third openings aligned to said plurality of first pins, a plurality of second fixers to fix said substrate, wherein said substrate holder can be separated from said base housing.

2. The apparatus of claim 1, wherein said base housing has an indented portion formed on one side of said surrounding wall to conveniently load or unload said substrate holder.

3. The apparatus of claim 1, wherein said lift means comprising:

a cylindrical housing having a fourth opening corresponding to said first opening such that said operational rod being in said cylindrical housing, a fifth opening formed at the top of said cylindrical housing;

a support member formed in said cylindrical housing upwardly passing through said cylindrical housing via said fifth opening, said support member having an oblique surface structure connected at the bottom of said support member, said oblique surface structure having an oblique surface at the bottom side of said oblique surface structure, said operational rod moving said support member upward and downward; and a second plate having a plurality of second pins connected to the top of said support member, said plurality of second pins being aligned to said second openings of said top surface.

4. The apparatus of claim 3, wherein said operational rod having a first rotatable unit mounted on an end of said operational rod for moving said oblique surface structure to upwardly move.

5. The apparatus of claim 4, wherein said operational rod having a second rotatable unit mounted on said operational rod between said first fixer and said first rotatable unit, and adjacent to said second rotatable unit to act as a supporter.

6. The apparatus of claim 1, wherein said substrate holder further comprises a plurality of holes having threads to fix a monitor wafer.

7. The apparatus of claim 1, wherein said substrate holder further comprises a plurality of metal sheets formed at the edge of said substrate holder to enhance the strength of said substrate holder.

8. The apparatus of claim 1, wherein said substrate holder further comprises a handle that can be separated from said substrate holder.

9. The apparatus of claim 1, wherein said second fixer further comprises a base plate formed attached on said substrate holder, a fixing member connected on said base plate via an rotating axis having a driving spring formed thereon.

10. An apparatus for holding a substrate, said apparatus comprising:

a base housing having a top surface, a bottom surface, and a surrounding wall connected to said top and bottom surfaces for providing a space to hold elements of said apparatus, said surrounding wall having a first opening, said top surface having a plurality of first pins and a plurality of second openings, wherein said base housing has an indented portion formed on one side of said surrounding wall for conveniently loading or unloading said substrate holder;

lift means formed in said base housing for lifting and lowering said substrate, said lift means including a cylindrical housing having a third opening corresponding to said first opening such that an operational rod being in said cylindrical housing, a fourth opening formed at the top of said cylindrical housing, a support member formed in said cylindrical housing upwardly passing through said cylindrical housing via said fourth opening, said support member having an oblique surface structure connected at the bottom of said support member, said oblique surface structure having an oblique surface at the bottom side of said oblique surface structure, said operational rod moving said support member upward and downward, a second plate having a plurality of second pins connected to the top of said support member, said plurality of second pins being aligned to said second opening of said top surface;

an operational rod connected to said lift means passing through said first opening and extending out of said base housing, wherein said operational rod can rotate via an axis set in said base housing, a first fixer in said base housing to fix said operational rod when said substrate is being raised, wherein said operational rod having a first rotatable unit mounted on an end of said operational rod for moving said oblique surface structure to upwardly move, wherein said operational rod having a second rotatable unit mounted on said operational rod between said first fixer and said first rotatable unit, and adjacent to said second rotatable unit to act as a supporter; and a substrate holder on said top surface of said base housing for holding said substrate including a first plate having a plurality of fifth openings aligned to said plurality of first pins, a plurality of second fixers to fix said substrate, wherein said substrate holder can be separated from said base housing.

11. The apparatus of claim 10, wherein said substrate holder further comprises a plurality of holes having threads to fix a monitor wafer.

12. The apparatus of claim 10, wherein said substrate holder further comprises a plurality of metal sheets formed at the edge of said substrate holder to enhance the strength of said substrate holder.

13. The apparatus of claim 10, wherein said substrate holder further comprises a handle that can be separated from said substrate holder.

14. The apparatus of claim 10, wherein said second fixer further comprises a base plate formed attached on said substrate holder, a fixing member connected on said base plate via an rotating axis having a driving spring formed thereon.

* * * * *